(12) United States Patent
Narita et al.

(10) Patent No.: US 7,819,668 B2
(45) Date of Patent: Oct. 26, 2010

(54) ELECTRICAL CONNECTING APPARATUS AND METHOD FOR MANUFACTURING THE SAME

(75) Inventors: Satoshi Narita, Aomori (JP); Kenji Sasaki, Aomori (JP); Nobuyuki Yamaguchi, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 383 days.

(21) Appl. No.: 11/938,054

(22) Filed: Nov. 9, 2007

(65) Prior Publication Data
US 2008/0143362 A1 Jun. 19, 2008

(30) Foreign Application Priority Data
Dec. 15, 2006 (JP) ............................. 2006-338314

(51) Int. Cl.
*G01R 31/02* (2006.01)
(52) U.S. Cl. ........................................ 439/66; 324/754
(58) Field of Classification Search ................. 439/66, 439/862; 324/754
See application file for complete search history.

(56) References Cited

U.S. PATENT DOCUMENTS

| 6,735,855 | B2 * | 5/2004 | Akram et al. ................. 29/832 |
| 7,049,837 | B2 * | 5/2006 | Kasukabe et al. ............ 324/754 |
| 7,227,370 | B2 * | 6/2007 | Kasukabe .................... 324/754 |
| 7,420,380 | B2 * | 9/2008 | Kasukabe et al. ............ 324/754 |
| 7,423,439 | B2 * | 9/2008 | Kasukabe et al. ............ 324/754 |

FOREIGN PATENT DOCUMENTS

| JP | 2002-509604 | 3/2002 |
| JP | 2002-340932 | 11/2002 |
| JP | 2003-043064 | 2/2003 |
| JP | 2003-227849 | 8/2003 |
| WO | WO 97/43653 | 11/1997 |

* cited by examiner

*Primary Examiner*—Gary F. Paumen
(74) *Attorney, Agent, or Firm*—Ingrassia Fisher & Lorenz, P.C.

(57) ABSTRACT

The present invention provides an electrical connecting apparatus in which no strong stress acts on a coupling portion of an arm portion continuing into a base portion by a moment force acting on the arm portion. A probe sheet comprising a probe sheet main body and a plurality of probes formed to be protruded from one surface of the probe sheet main body is provided. For formation of the arm portion of the probe, a metal material for an arm main body portion continuing into a probe tip portion is deposited on a base table with an approximately uniform height dimension. Also, a metal material for a reinforcing portion constituting an arm portion together with the arm main body portion is deposited at an area on the arm main body portion distanced from the probe tip portion with an approximately uniform height dimension. Further, a metal material for forming a base portion that is connected to at least the reinforcing portion is deposited without covering a step consisting of one end of the reinforcing portion located on the probe tip portion side and the arm main body portion. Thus, the arm portion in which a height dimension at a coupling portion with the base portion is larger than that at another part except the coupling portion is formed.

6 Claims, 9 Drawing Sheets

ELECTRICAL CONNECTING APPARATUS AND METHOD FOR MANUFACTURING THE SAME

BACKGROUND OF THE INVENTION

The present invention relates to an electrical connecting apparatus used in an electrical test of a semiconductor device such as a semiconductor IC chip or a semiconductor wafer on which the semiconductor IC chips are collectively incorporated and a method for manufacturing the same.

In the electrical test of this kind, a probe sheet comprising a probe sheet main body having flexible electrical insulating synthetic resin films and conductive paths supported by the synthetic resin films and a plurality of probes (contactors) formed to be protruded from one surface of the probe sheet main body and connected to the conductive paths is used between a tester main body and a device under test in general (e.g., refer to Patent Document 1).

Each probe of the probe sheet is connected to an electrical circuit of the tester main body via the conductive path of the probe sheet main body. Also, the probe sheet is applied to the device under test so that the probe tip of each probe contacts a corresponding electrode of the device under test. By the electrical contact with use of the probe sheet, the device under test is connected to the tester main body.

As an example of each of the plurality of probes provided on the probe sheet, a so-called micro cantilever probe of a cantilever type is raised (e.g., refer to Patent Documents 2 to 4). This probe comprises a base portion supported on the probe sheet main body and an arm portion extending in a lateral direction from the lower end of the base portion with a space from the probe sheet, and at the tip end of the arm portion is formed a probe tip portion protruded in a direction distanced from the probe sheet main body.

In the probe sheet using this micro cantilever probe, when the probe tip of the probe tip portion formed at its tip end is thrust on the corresponding electrode with a predetermined overdriving force, a moment force acts on the arm portion of the probe. This moment force is stronger at a point more distanced from the probe tip portion in a range from the probe tip portion as an acting point to the base portion as a supporting point of the arm portion. Thus, the strongest stress acts on a coupling portion that is a transition point from the arm portion to the base portion continued from it.

Meanwhile, to manufacture such a probe sheet, which corresponds to a micro array pitch of the electrodes of the device under test on which the tip ends (probe tips) of the probe tip portions of the respective probes are thrust, a photolithographic technique is utilized. Specifically, probe materials are deposited sequentially in an order from a material for the probe tips to a material for the base portions of the plurality of probes per probe sheet, thus to form the plurality of probes integrally. Subsequent to the formation of the plurality of probes, the probe sheet main body to which these probes are connected is formed integrally with the probes.

[Patent Document 1] Japanese Patent Appln. Public Disclosure No. 2002-340932

[Patent Document 2] Japanese Patent Appln. Public Disclosure No. 2003-43064

[Patent Document 3] Japanese Patent Appln. Public Disclosure No. 2003-227849

[Patent Document 4] Japanese Patent Appln. Public Disclosure No. 2002-509604

BRIEF SUMMARY OF THE INVENTION

In terms of the relationship between the aforementioned stress and the strength of the arm portion, it is ideal that the cross-sectional area of the arm portion should gradually increase from the probe tip portion toward the base portion in accordance with gradual increase of the stress. However, since the probe sheet having a micro-structure utilizing the aforementioned photolithographic technique has a problem of interference between the probes adjacent to one another in a fine pitch, it is difficult to gradually increase the width dimension of the arm portion of the probe from the probe tip portion toward the base portion for the purpose of gradual increase of its cross-sectional area.

Also, in the conventional manufacturing method utilizing the aforementioned photolithographic technique, a single mask is used to deposit a metal material for the arm portion of the probe in a predetermined flat surface shape of the arm portion. That is, the arm portion of the probe is formed in a metal material deposition process using this single mask. Accordingly, the height dimension of the arm portion of the probe is formed to be approximately uniform in its length direction.

Thus, in the probe formed by the conventional manufacturing method, since the cross-sectional area of the arm portion from the probe tip portion toward the base portion is approximately uniform, it has been impossible to prevent the strong moment force from acting on the coupling portion that is a transition point from the arm portion to the base portion.

Since the coupling portion between the arm portion and the base portion on which the strong stress acts may suffer from breakage and damage, it has been strongly desired to attempt to reduce the stress on this coupling portion.

It is an object of the present invention to provide an electrical connecting apparatus comprising a probe in which a conventional strong stress does not act by an overdriving force on a coupling portion that is a transition point from an arm portion to a base portion formed integrally with the arm portion.

An electrical connecting apparatus manufacturing method according to the present invention is a method for forming a probe and a probe sheet main body integrally with use of a photolithographic technique, and comprises the steps of depositing a metal material for an arm main body portion continuing into a probe tip portion for the probe on a base table with an approximately uniform height dimension, depositing a metal material for a reinforcing portion constituting an arm portion together with the arm main body portion at an area on the arm main body portion distanced from the probe tip portion with an approximately uniform height dimension, depositing a metal material for forming a base portion that is connected to at least the reinforcing portion without covering a step consisting of one end of the reinforcing portion located on the probe tip portion side and the arm main body portion, and forming the probe sheet main body to which the base portion is connected with a space from the arm portion.

In the electrical connecting apparatus manufacturing method according to the present invention, for formation of the arm portion of the probe, a metal material for an arm main body portion continuing into a probe tip portion is deposited on a base table with an approximately uniform height dimension. Also, a metal material for a reinforcing portion constituting an arm portion together with the arm main body portion is deposited at an area on the arm main body portion distanced from the probe tip portion with an approximately uniform height dimension. Further, a metal material for forming a base portion that is connected to at least the reinforcing portion is deposited without covering a step consisting of one end of the reinforcing portion located on the probe tip portion side and the arm main body portion. Thus, a height dimension at a coupling portion of the arm portion with the base portion is larger than that of the arm portion on the probe tip portion side due to the reinforcing portion.

Since the increase in the height dimension of the arm portion at the coupling portion causes increase in the cross-sectional area at the coupling portion, a bending moment force acting on the coupling portion is smaller than in a conventional case. As a result, damage such as a crack or breakage on the coupling portion caused by the bending moment can be prevented reliably.

For formation of the arm main body portion, the reinforcing portion, and the base portion, a process of depositing each metal material in a recess formed with resist by deposition of a photoresist film and partial exposure and development to the photoresist film is repeated, and the same metal material is deposited in the each deposition step, and thereby the arm portion consisting of the arm main body portion and the reinforcing portion and the base portion can be formed integrally.

Also, an electrical connecting apparatus according to the present invention comprises a probe sheet main body having flexible electrical insulating synthetic resin films and conductive paths supported by the synthetic resin films, and a plurality of probes formed to be protruded from one surface of the probe sheet main body and connected to the conductive paths. The probe comprises a base portion combined with the conductive path and formed to be protruded from the one surface of the probe sheet main body, an arm portion continuing into the base portion and extending in a lateral direction with a space from the one surface of the probe sheet main body, and a probe tip portion protruded at an extending end of the arm portion in a direction distanced from the one surface of the probe sheet main body, and in terms of the arm portion, a height dimension at a coupling portion with the base portion is larger than that in the vicinity of the probe tip portion.

With the electrical connecting apparatus according to the present invention, since the cross-sectional area at the coupling portion of the arm portion is increased, and a bending moment force acting on the coupling portion is smaller than in a conventional case, as described above, damage such as a crack or breakage caused by the bending moment acting on the coupling portion can be prevented reliably.

A step across the extending direction of the arm portion can be formed on one surface of the arm portion facing the probe sheet main body. Thus, it is possible to set a height dimension of the arm portion at a part located on the base portion side from the step to be larger than a height dimension at a part located on the probe tip portion side from the step.

The plurality of probes can be formed integrally on a base table by sequentially depositing metal materials for the plurality of probes in an order from a material for probe tips to a material for base portions with use of a photolithographic technique. The probe sheet main body to be combined with the base portions of the respective probes held on the base table is formed over the base table, and the probes are detached together with the probe sheet main body from the base table, thus to obtain the electrical connecting apparatus.

More specifically, the electrical connecting apparatus can be obtained by forming a probe tip portion for a probe on a base table, depositing a metal material for an arm main body portion continuing into the probe tip portion on the base table with an approximately uniform height dimension, depositing a metal material for a reinforcing portion constituting an arm portion together with the arm main body portion at an area on the arm main body portion distanced from the probe tip portion with an approximately uniform height dimension, depositing a metal material for forming a base portion that is connected to at least the reinforcing portion without covering a step consisting of one end of the reinforcing portion located on the probe tip portion side and the arm main body portion, and forming the probe sheet main body to which the base portion is connected with a space from the arm portion.

According to the present invention, it is possible to prevent damage such as a crack or breakage caused by a bending moment acting on an arm portion from occurring at a coupling portion between the arm portion and a base portion reliably. Thus, breakage of the arm portion of the probe caused by an overdriving force can be prevented reliably, and durability of the electrical connecting apparatus is improved.

BRIEF DESCRIPTION OF THE DRAWINGS

FIGS. 4 (*a*) and 4 (*b*) are partially enlarged cross-sectional view of the probe sheet in FIG. 3, and FIG. 4 (*a*) is a partially enlarged view of the probe sheet and a support block, and FIG. 4 (*b*) is an enlarged view of a probe of the probe sheet.

DESCRIPTION OF THE PREFERRED EMBODIMENTS

Figure 1:
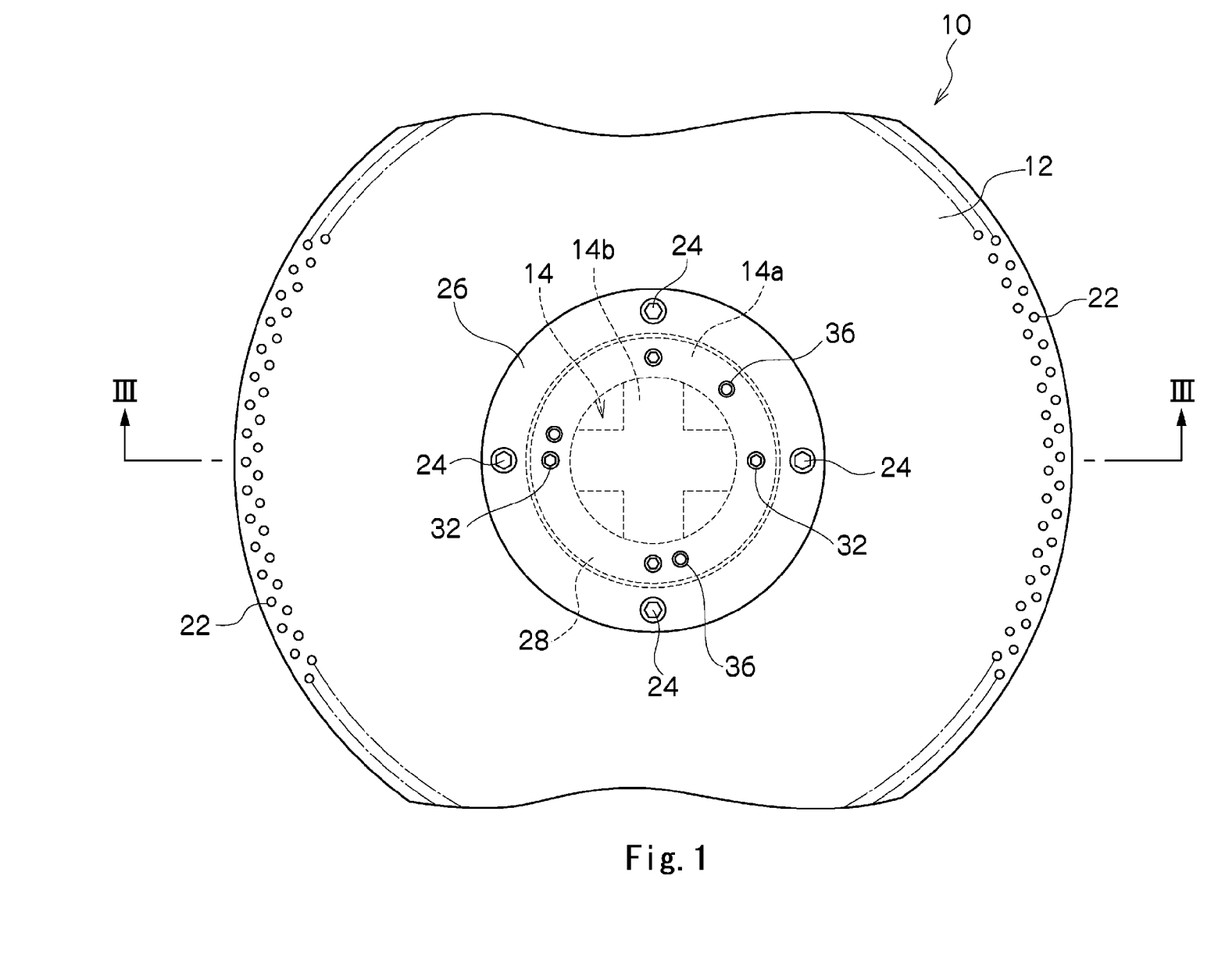
FIG. 1 is a top view of a probe assembly in which a probe sheet according to the present invention has been incorporated.
Figure 2:
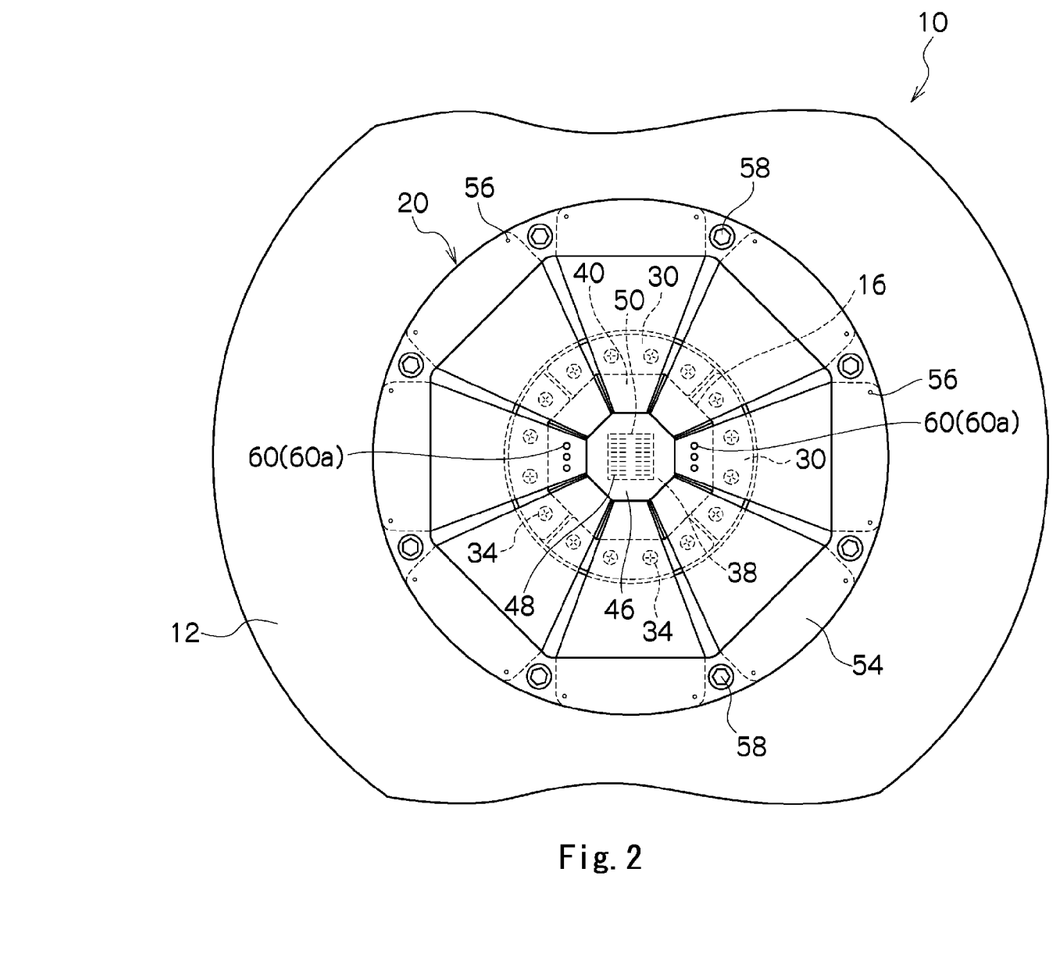
FIG. 2 is a bottom view of the probe sheet shown in FIG. 1.
Figure 3:
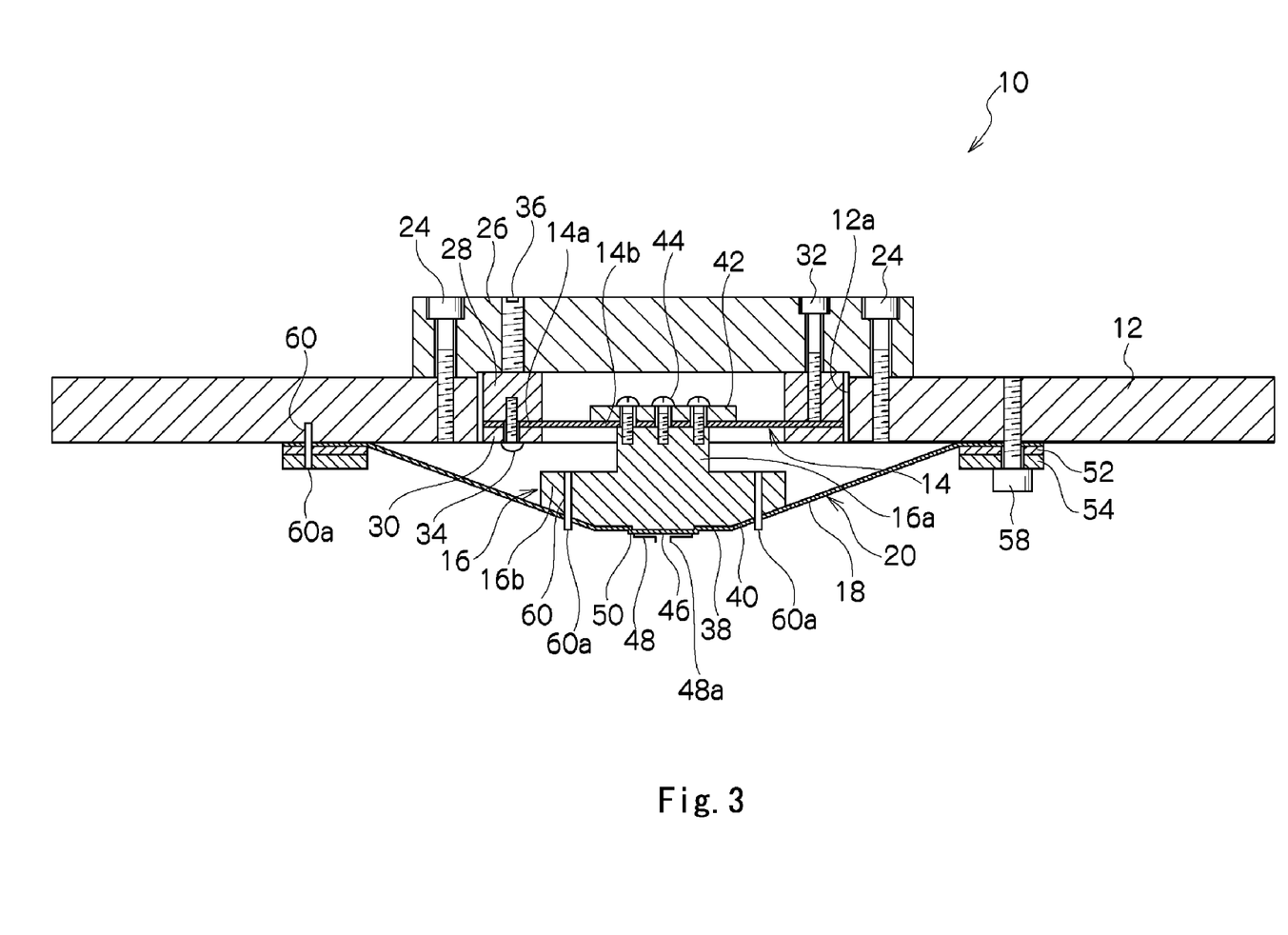
FIG. 3 is a cross-sectional view obtained along the line III-III shown in FIG. 1.

A probe assembly 10 according to the present invention is shown in FIGS. 1 to 3. As clearly shown in the cross-sectional view in FIG. 3, the probe assembly 10 comprises a rigid wiring board 12, a block 16 elastically supported by the rigid wiring board via a spring member 14, and a probe sheet 20 having a flexible wiring board 18 in which a plurality of conductive paths 18*a* (refer to FIG. 4) electrically connected respectively to a plurality of not-shown wiring paths on the rigid wiring board 12 are provided. In the present embodiment, the flexible wiring board 18 according to the present invention is used as a probe sheet main body of the probe sheet 20.

The rigid wiring board 12 has a plate-shaped electrical insulating base member made of epoxy resin containing e.g. glass fiber and wiring paths on the base member, as is well known as a conventional rigid printed wiring board. The wiring paths of the rigid wiring board 12 are connected to an electrical circuit of a not-shown tester main body via tester lands 22 provided at the outer edge of the rigid wiring board 12 and respectively corresponding to the wiring paths. In the example shown in the figure, a round rigid wiring board having a round opening 12a (refer to FIG. 3) at the center is used as the rigid wiring board 12.

The spring member 14 is made of a plate-shaped spring member and comprises an annular support portion 14a (refer to FIG. 1) having a smaller outer diameter than the diameter of the round opening 12a of the rigid wiring board 12 and a cross-shaped main body portion 14b (refer to FIG. 1) arranged across the inside of the annular support portion, as shown in FIG. 3.

On the upper surface of the rigid wiring board 12 is fixed a round support plate 26 made of a metal such as stainless steel via bolts 24 screwed in the rigid wiring board 12 at parts that are not in the way of the wiring paths, as shown in FIGS. 1 to 3. The support plate 26 supports the rigid wiring board 12 and acts to reinforce the rigid wiring board.

The spring member 14 is held within the round opening 12a via an annular attaching plate 28 and annularly and mutually combined plural thrusting plates 30 that sandwich the annular support portion 14a from both surfaces, as shown in FIG. 3. To hold the spring member 14, the attaching plate 28 is attached to the lower surface of the support plate 26 with bolts 32, and each of the thrusting plates 30 is attached to the attaching plate 28 with bolts 34 penetrating the thrusting plate and the support portion 14a of the spring member 14 and screwed in the attachment plate 28. In this manner, the spring member 14 is held within the round opening 12a across the opening.

Also, parallelism adjusting screw members 36 for adjusting the holding posture of the spring member 14 in a state where the bolts 32 are loosened are screwed in the support plate 26 so that their tip ends can abut on the top surface of the attaching plate 28, as shown in FIG. 3.

On the main body portion 14b of the spring member 14 held within the round opening 12a of the rigid wiring board 12 is fixed the aforementioned block 16. The block 16 comprises a stem portion 16a having a rectangular cross section and a support portion 16b continued from the lower end of the stem portion and having an equilateral octagonal cross section, in the example shown in the figure. At the center of the lower portion of the support portion 16b is formed an octagonal flat bottom surface 38 as shown in FIG. 2, and on the outer rim of the bottom surface are formed taper surfaces 40 continued from its respective sides.

Referring to FIG. 3 again, the block 16 is combined with the main body portion 14b of the spring member 14 on the top surface of the stem portion 16a with its bottom surface 38 facing downward. For this combination, a fixing plate 42 that sandwiches the main body portion 14b together with the stem portion 16a is fixed over the stem portion 16a with screw members 44 screwed in the stem portion 16a.

Also, the flexible wiring board 18, that is, the probe sheet main body 18, of the probe sheet 20 has at the center an octagonal portion 46 formed to correspond to the bottom surface 38 of the block 16, and at the center of the octagonal portion is formed a contactor area 50 in which a plurality of probes 48 are arranged with their probe tips 48a aligned, as shown in FIGS. 2 and 3. This contactor area 50 is formed in a rectangular shape in the example shown in FIG. 2.

The probe sheet 20 is fixed on the bottom surface 38 via adhesive as described later with the probe tips 48a of the plurality of probes 48 protruded from the contactor area 50 of the probe sheet main body 18 directing downward so that the back surface of the octagonal portion 46 is supported on the bottom surface 38 and the taper surfaces 40 of the block 16, as shown in FIG. 3. Also, the outer edge of the probe sheet 20 is combined with the rigid wiring board 12 so that the portion extending outward from the octagonal portion 46 is slightly slack.

To combine the aforementioned outer edge of the probe sheet 20 with the rigid wiring board 12, elastic rubber rings 52 are arranged along the outer edge of the probe sheet 20, and ring fittings 54 covering the elastic rubber rings 52 are also arranged. The relative positions of the outer edge of the probe sheet 20 and the both members 52, 54 to the rigid wiring board 12 are determined by positioning pins 56, as shown in FIG. 2. By tightening screw members 58 penetrating the probe sheet 20 and the both members 52, 54 into the rigid wiring board 12, the outer edge of the probe sheet 20 is combined with the rigid wiring board 12. Due to the combination of the aforementioned outer edge with the rigid wiring board 12, the aforementioned conductive paths 18a of the probe sheet 20 are electrically connected to the aforementioned corresponding wiring paths on the rigid wiring board 12, in a similar manner as in the conventional case.

In the example shown in FIGS. 2 and 3, alignment pins 60 are provided to penetrate the probe sheet 20. At the lower ends of the alignment pins 60 are provided alignment marks 60a that can be captured by a camera supported to a table (not shown) supporting a device under test.

Since information on the relative position of the probe assembly 10 to the aforementioned table is obtained from the capture image of these alignment marks 60a, based on this positional information, the relative position of the probe assembly 10 to the aforementioned support table is adjusted so that the probe tip 48a of each probe 48 contacts each corresponding electrode of the device under test on the aforementioned table accurately. Thereafter, the probe tip 48a of each probe 48 electrically contacts the corresponding electrode, and thus an electrical test of the aforementioned device under test by the aforementioned tester main body is performed.

Figure 4:
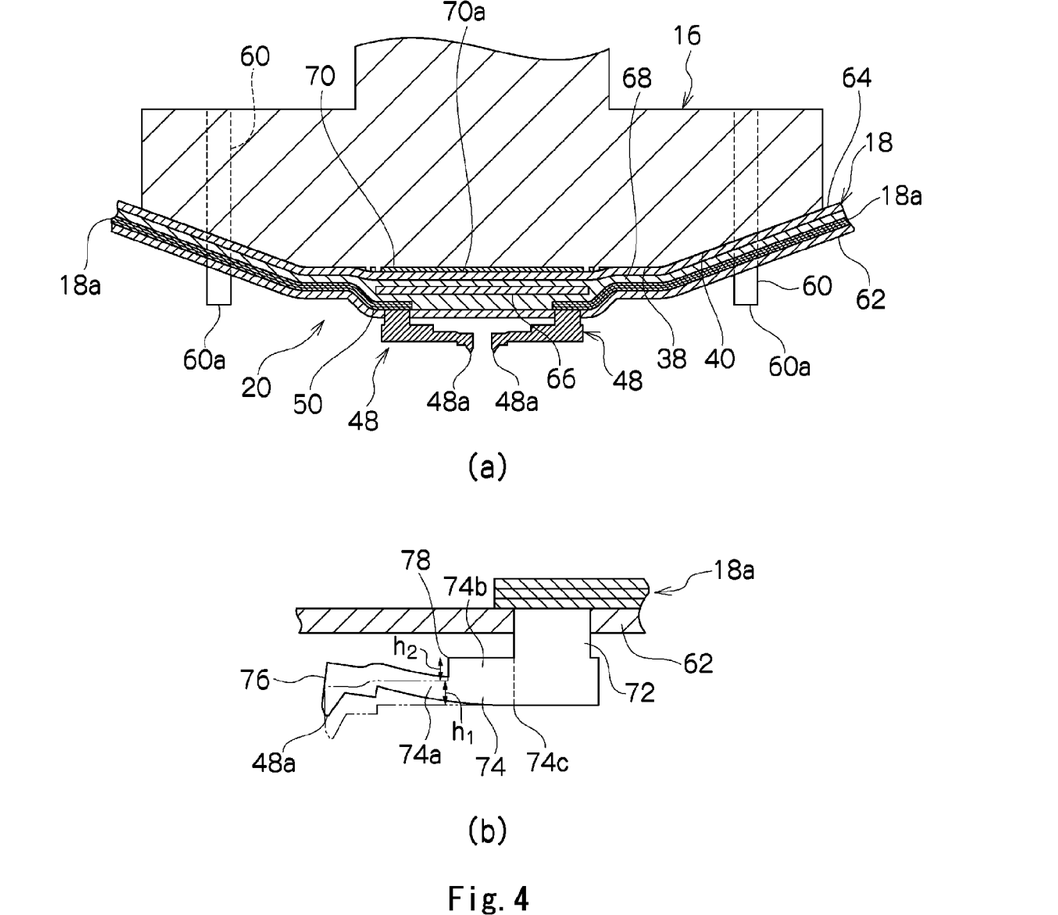

The structure of the aforementioned probe sheet 20 is described in details with reference to FIG. 4. The probe sheet 20 has a pair of flexible electrical insulating synthetic resin films 62, 64 such as polyimide resin, and the conductive paths 18a are buried between the both resin films, as shown in FIG. 4 (*a*).

The conductive path 18a of the probe assembly 10 according to the present invention adopts a laminated structure in the example shown in FIG. 4 (*a*). This laminated structure is, for example, a three-layered laminated structure having a pair of first conductive material layers made of a conductive material, such as copper, having high conductivity suitable for use as an electrical wire and a second conductive material layer made of a metal material, such as nickel or nickel-phosphor alloy, having higher resiliency than that of the first conductive material layers and sandwiched between the pair of first conductive material layers. Forming the conductive path 18a in such a three-layer structure heighten the strength of the conductive path 18a, which leads prevention of damage and improvement of durability.

To each conductive path 18a is connected the probe 48 protruded from one electrical insulating synthetic resin film 62. Also, corresponding to the contactor area 50 (refer to FIG. 2) to which each probe 48 is arranged, a plate-shaped reinforcing plate 66 made of, for example, a ceramic plate having approximately the same size and shape as those of the contactor area is buried between the both electrical insulating synthetic resin films 62, 64 to partially cover the conductive paths 18a. This reinforcing plate 66 can be fixed between the both electrical insulating synthetic resin films 62, 64 via an adhesive sheet 68 such as a synthesis resin sheet, as shown in the figure. Since the reinforcing plate 66 has higher rigidity than that of the electrical insulating synthetic resin films 62, 64, deformation of an area of the probe sheet main body 18 corresponding to the reinforcing plate 66 by an external force is restricted.

Although another plate-shaped member may be used as the reinforcing force 66, a ceramic plate is preferable because it is light and less likely suffers from thermal deformation. Since the reinforcing plate 66 made of the ceramic plate less likely suffers from deformation by thermal expansion or contraction, it effectively restricts deformation of the probe sheet main body 18 by thermal expansion or contraction as well as the aforementioned deformation of the probe sheet 18 by an external force.

At the bottom surface 38 of the block 16 receiving the back surface of the probe sheet main body 18 is opened downward a rectangular center recess 70 that accommodates adhesive 70a. The contactor area 50 of the probe sheet main body 18 is fixed to the bottom surface 38 of the block 16 by the adhesive 70a accommodated in the center recess 70.

Each probe 48 provided on the probe sheet main body 18 comprises a base portion 72 penetrating the electrical insulating synthetic resin film 62 from the conductive path 18a of the probe sheet main body 18 and extending downward, an arm portion 74 extending in a lateral direction from the lower end of the base portion with a space from and approximately in parallel with the electrical insulating synthetic resin film 62 that forms the lower surface of the probe sheet main body 18, and a probe tip portion 76 formed at the tip end of the arm portion and protruded downward to be distanced from the aforementioned lower surface 62 of the probe sheet main body 18, as shown in FIG. 4 (b). At the tip end of the probe tip portion 76 is formed the aforementioned probe tip 48a.

The arm portion 74 has a main body portion 74a having a uniform height dimension in the longitudinal direction from the base portion 72 to the probe tip portion 76 and a reinforcing portion 74b formed on the main body portion 74a at a half part of the arm portion 74 on the base portion 72 side along the longitudinal direction. The main body portion 74a has a height dimension of h1, and the reinforcing portion 74b on the main body portion 74a has a height dimension of h2. Thus, on a surface of the arm portion 74 facing the probe sheet main body 18 is formed a step 78 having a height of h2 to go across the arm portion 74 in the width direction.

In each probe 48 of the probe assembly 10 according to the present invention, the reinforcing portion 74b is formed at a half part of the arm portion 74 continuing into the base portion 72. Thus, the height dimension at a coupling portion 74c of the arm portion 74 continuing into the base portion 72 is increased as much as the height dimension h2 of the reinforcing portion 74b.

Accordingly, since the cross-sectional area at the aforementioned coupling portion of the arm portion 74 is increased, a moment force acts on the arm portion 74 according to the distance in a range from the probe tip 48a as an acting point to the base portion 72 as a supporting point when the probe tip 48a is thrust on the aforementioned electrode by an overdriving force, as shown in FIG. 4 (b). This moment force is the strongest in the vicinity of the coupling portion 74c of the arm portion 74, but since the cross-sectional area at the coupling portion 74c is large due to the reinforcing portion 74b as described above, the moment force is decreased.

Thus, since no large moment force acts on the coupling portion 74c between the arm portion 74 and the base portion 72 as in the conventional case, and the strength of the coupling portion 74c is heightened relatively, damage on the coupling portion 74c caused by the aforementioned overdriving can be prevented reliably. As a result, durability of the probe 48 and also the probe assembly 10 is improved.

Next, a method for manufacturing the probe sheet 20 according to the present invention is described with reference to FIGS. 5 to 9. For simplification of description and drawings, the following embodiment is described in terms of a single probe representing a plurality of contactors or probes formed at the same time.

Figure 5:
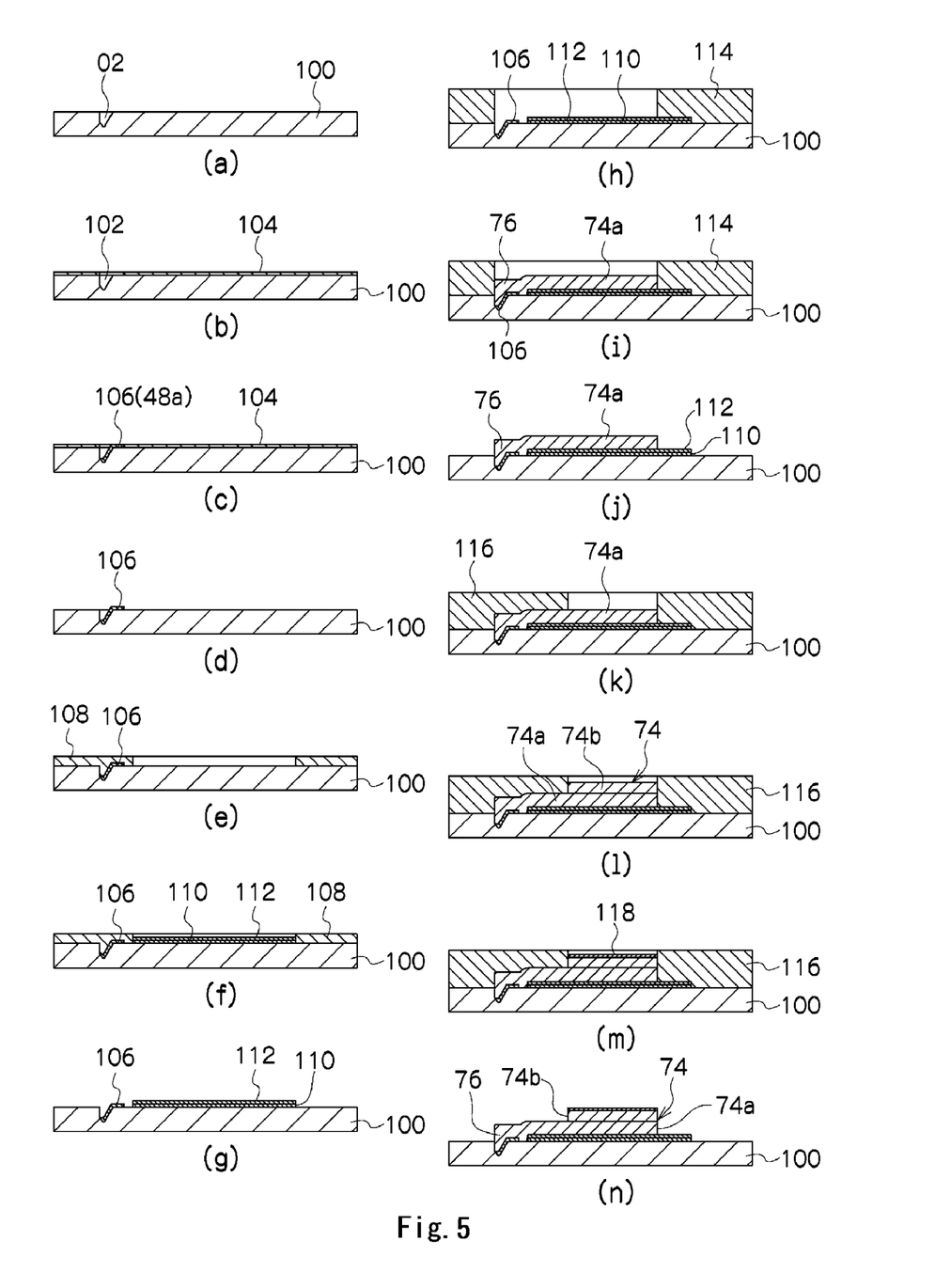
FIG. 5 is a process description diagram (No. 1) showing a process for manufacturing the probe sheet according to the present invention.

In the method for manufacturing the probe sheet according to the present invention, a metal plate such as a stainless steel plate is used as a base table 100, and on its surface is formed a hitting mark by, for example, an indenter to form a recess 102 for the probe tip of the probe 48, as shown in FIG. 5 (a). Although a single recess 102 is shown in the figure, as many recesses 102 as the probes 48 to be formed on the aforementioned contactor area 50 are formed with a predetermined probe tip pitch, as is apparent from the above description.

After formation of the recess 102, a pattern mask 104 that takes the form of the probe tip 48a of the probe 48 is formed at an area including the recess 102 by selective exposure and development processing with photoresist with use of a photolithographic technique (FIG. 5 (b)).

With use of this pattern mask 104, a metal 106 for the probe tip 48a is deposited in and around the recess 102 by, for example, electroplating (FIG. 5 (c)). As a metal material for the probe tip 48a, a hard metal such as rhodium or palladium-cobalt alloy is used. After deposition of the metal 106, the pattern mask 104 is removed (FIG. 5 (d)).

After removal of the pattern mask 104, a pattern mask 108 for a sacrificial layer to be removed after completion of the probe sheet 20 is formed on the base table 100 with photoresist with use of a photolithographic technique similar to one described above, as shown in FIG. 5 (e).

For the aforementioned sacrificial layer, a nickel layer 110 is first deposited at an area where the base table 100 is exposed from the pattern mask 108 by, for example, an electroplating technique. Subsequently, a copper layer 112 is deposited on the nickel layer 110 by a similar plating technique (FIG. 5 (f)). On the base table 100, metal materials for forming the arm portion 74 and the probe tip portion 76 of the probe 48 will be deposited later on, and the copper layer 112 functions to make it easy to detach the probe 48 formed by the deposition of the metal materials from the base table 100. Also, the copper layer 112 is deposited over the base table 100 via the nickel layer 110 because it is difficult to deposit the copper layer 112 directly on the base table 100.

After formation of the aforementioned sacrificial layer 112, the pattern mask 108 is removed (FIG. 5 (g)). Thereafter, a pattern mask 114 for the probe tip portion 76 and the main body portion 74a of the arm portion 74, continuing into the probe tip portion, of the probe 48 is formed with photoresist similar to one described above (FIG. 5 (h)). In an area exposed from the pattern mask 114, a metal material for the probe tip portion 76 and the main body portion 74a of the probe 48 is deposited on the metal 106 for the probe tip 48a and the sacrificial layer 110 by a plating technique such as an electroforming technique. In this manner, the arm main body portion 74a is formed integrally with the probe tip 48a that is the metal 106 (FIG. 5 (i)). As a metal material for the probe tip portion 76 and the main body portion 74a, a nickel-phosphor alloy is used, for example.

The probe tip portion 76 and the main body portion 74a may be formed in separate deposition processes. However, as described above, it is preferable in terms of process simplification to form the probe tip portion 76 and the main body portion 74*a* at the same time. Also, as shown in FIG. 5 (*i*), a step is formed at a coupling portion of the main body portion 74*a* with the probe tip portion 76, corresponding to the space between the layers 110 and 112 and the metal 106, and the height dimension (h1) of the main body portion 74*a* will not change by this step, but the main body portion 74*a* is formed with a uniform height (h1) in its length direction.

After formation of the probe tip portion 76 and the main body portion 74*a*, the pattern mask 114 is removed (FIG. 5 (*j*)). Thereafter, a pattern mask 116 exposing a half of the surface of the main body portion 74*a* located on the opposite side of the probe tip portion 76 is formed (FIG. 5 (*k*)).

In the opening of the pattern mask 116, the same metal material as that for the main body portion 74*a* is deposited by the same technique, for example. In this manner, the reinforcing portion 74*b* is formed on the main body portion 74*a* (FIG. 5 (*l*)). The reinforcing portion 74*b* has a uniform height dimension along the longitudinal direction of the main body portion 74*a*. By the formation of the reinforcing portion 74*b* on the main body portion 74*a*, the arm portion 74 having the aforementioned step 78 is formed.

After formation of the arm portion 74, a copper layer 118 that functions as a protective layer in a perforating operation with laser described later is formed on the reinforcing portion 74*b* by a plating technique (FIG. 5 (*m*)), and after formation of the copper layer 118, the pattern mask 116 is removed (FIG. 5 (*n*)).

Next, a second sacrificial layer that will be a reference plane of the probe sheet main body 18 is formed. Prior to formation of the second sacrificial layer, a pattern mask 120, made of photoresist, covering the arm portion 74 with which the probe tip portion 76 has been formed integrally on the base table 100 is formed by a photoresist technique similar to one described above (FIG. 6 (*a*)). At an area exposed from the pattern mask 120 over the base table 100 is deposited a metal material for a second sacrificial layer 122 (FIG. 6 (*b*)). Nickel may be used as a material for the second sacrificial layer 122 and may be deposited by a plating technique.

Figure 6:
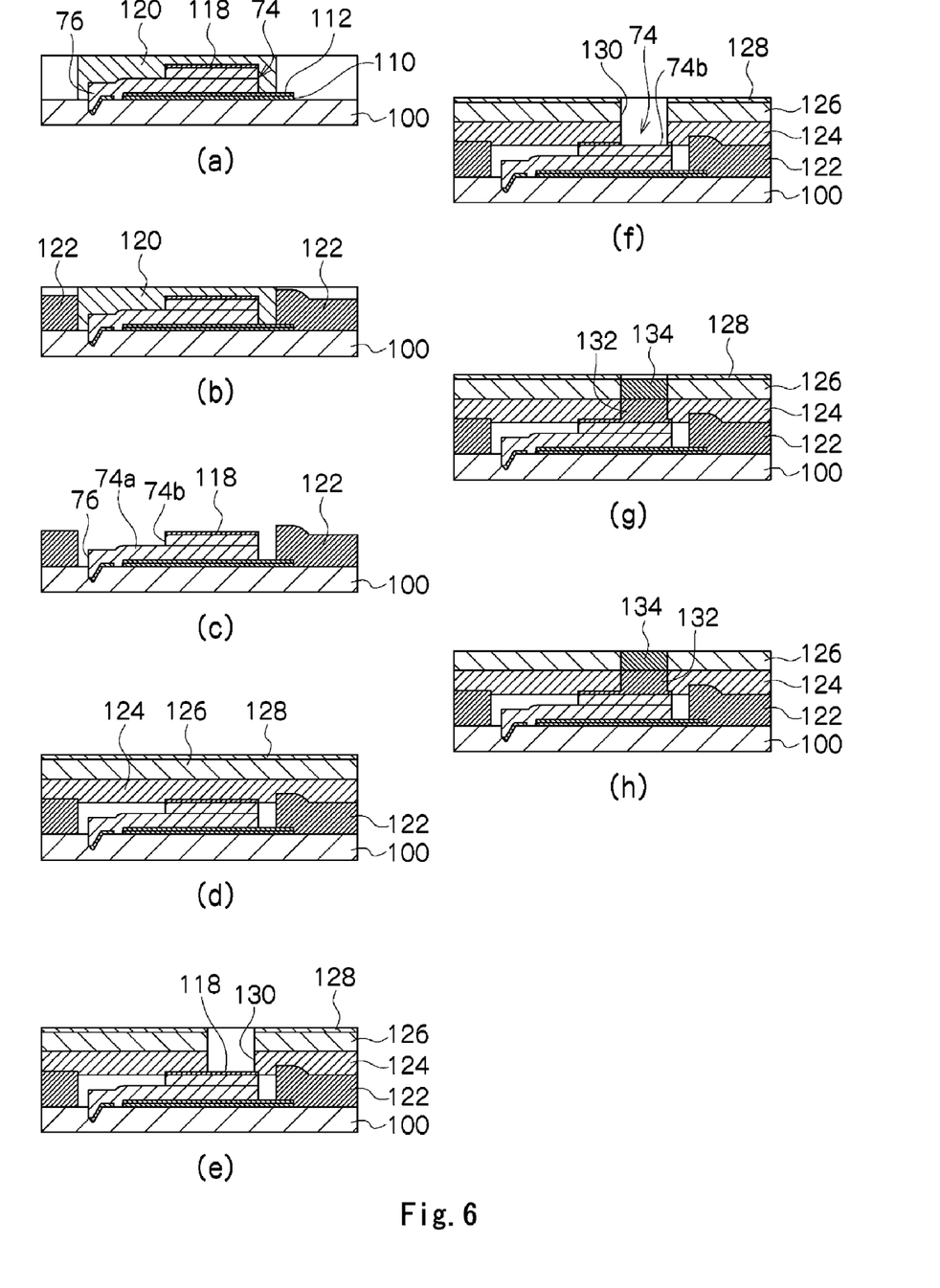
FIG. 6 is a process description diagram (No. 2) showing a process for manufacturing the probe sheet according to the present invention.

After formation of the second sacrificial layer 122, the pattern mask 120 is removed, as a result of which the second sacrificial layer 122 as a reference plate of the probe sheet main body 18, the probe tip portion 76, and the arm portion 74 are exposed on the base table 100 (FIG. 6 (*c*)). On these exposed portions are sequentially formed a dry film 124 as a third sacrificial layer, a resin layer 126 for the first electrical insulating synthetic resin film 62 of the probe sheet main body 18, and a protective film 128 made of resist (FIG. 6 (*d*)).

In a state where the surface of the resin layer 126 or the first electrical insulating synthetic resin film 62 is protected by the protective film 128, an opening 130 that reaches the copper layer 118 on the arm portion 74 is formed with use of, for example, laser beam (FIG. 6 (*e*)). The lower end of this opening 130 is an end portion of the reinforcing portion 74*b* of the arm portion 74 located on the opposite side of the probe tip portion 76 and is opened on the copper layer 118. The copper layer 118 covers the upper surface of the reinforcing portion 74*b* to protect the reinforcing portion from the laser beam.

After formation of the opening 130, the copper layer 118 in the opening 130 is removed by etching, and the reinforcing portion 74*b* is exposed in the opening 130 (FIG. 6 (*f*)). In the opening 130, a nickel layer 132 for forming the base portion 72 of the probe 48 is deposited by a plating technique on the reinforcing portion 74*b* so as to be integrated with the reinforcing portion 74*b*, for example. The thickness dimension of the nickel layer 132 in the opening 130 exceeds the thickness dimension of the dry film or the third sacrificial layer 124 but never exceeds the sum of the thickness dimensions of the sacrificial layer and the resin layer 126. Thus, the upper surface of the nickel layer 132 is located within the thickness range of the resin layer 126 for the electrical insulating synthetic resin film 62.

On the upper surface of the nickel layer 132 is deposited a copper layer 134 by a plating technique so as to be integrated with the nickel layer 132 (FIG. 6 (*g*)). Thus, the dissimilar metal joint area of these both metals 132, 134 exists within the thickness range of the resin layer 126 or the electrical insulating synthetic resin film 62. The aforementioned dissimilar metal joint area is hereby protected by the electrical insulating synthetic resin film 126 (62). The copper layer 134 has a thickness dimension enough for its upper surface to approximately correspond to the upper surface of the resin layer 126. After deposition of the copper layer 134, the protective film 128 is removed (FIG. 6 (*h*)).

Figure 7:
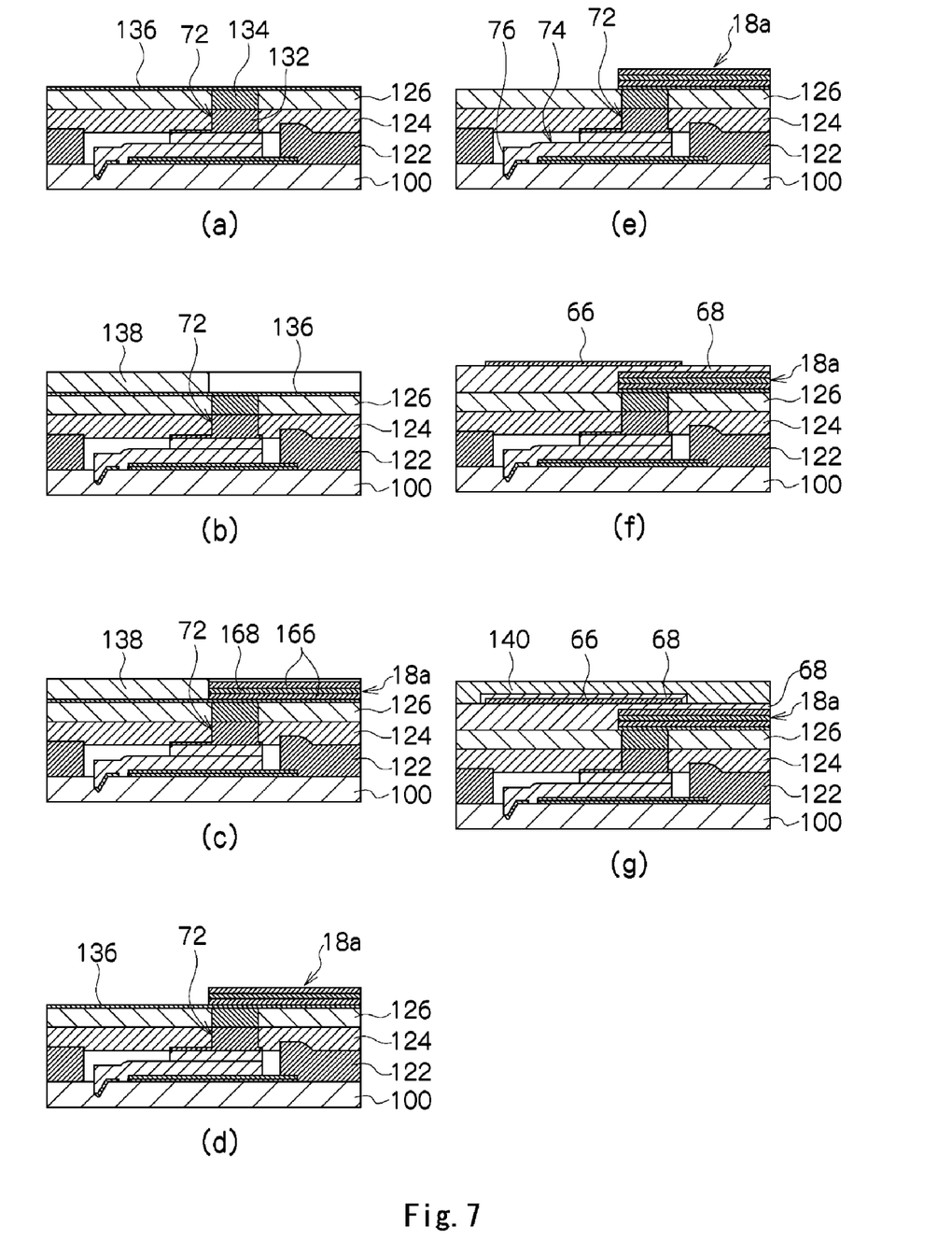
FIG. 7 is a process description diagram (No. 3) showing a process for manufacturing the probe sheet according to the present invention.

On the resin layer 126 and the copper layer 134 exposed as a result of removal of the protective film 128 is formed a copper layer 136 having a thickness dimension of, for example, 0.3 μm for growing the conductive path 18*a* by, for example, sputtering, as shown in FIG. 7 (*a*).

Thereafter, as shown in FIG. 7 (*b*), a pattern mask 138 taking the form of the conductive path area on the copper layer 136 is formed on the copper layer 136 with photoresist by a photolithographic technique. In an area exposed from the pattern mask 138 are sequentially deposited a copper layer 166 having a thickness dimension of 10 μm, a nickel layer 168 having a thickness dimension of 2 μm, and a copper layer 166 having a thickness dimension of 10 μm for the conductive path 18*a* by, for example, a plating technique (FIG. 7 (*c*)).

After the conductive path 18*a* is formed as a result of deposition of the copper layer 166, the nickel layer 168, and the copper layer 166, the pattern mask 138 is removed (FIG. 7 (*d*)), and a part of the copper layer 136 running off from the conductive path 18*a* is removed by etching (FIG. 7 (*e*)). In this manner, the conductive path 18*a* excellent in strength against breakage is formed.

On the resin layer 126 or the electrical insulating synthetic resin film 62, exposed as a result of removal of the pattern mask 138 and partial removal of the copper layer 136, and the conductive path 18*a* on the film, an adhesive sheet 68 made of a synthetic resin material is bonded, and the ceramic plate 66 covering the contactor area 50 is arranged on the sheet, as shown in FIG. 7 (*f*). Further, after a similar adhesive sheet 68 is arranged to cover the ceramic plate 66, a polyimide resin layer 140 for forming the other electrical insulating synthetic resin film 64 is deposited to cover them, as shown in FIG. 7 (*g*).

Figure 8:
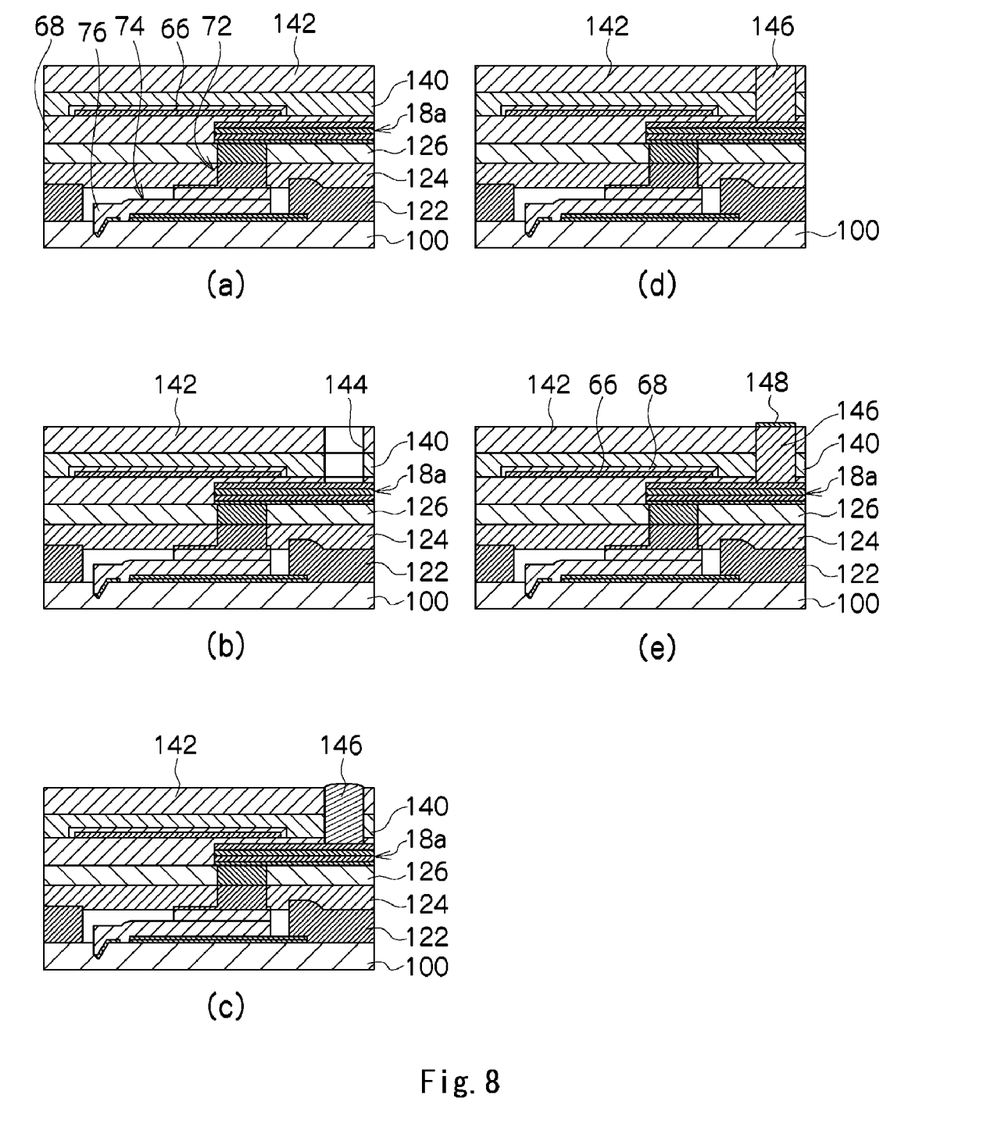
FIG. 8 is a process description diagram (No. 4) showing a process for manufacturing the probe sheet according to the present invention.

After formation of the polyimide resin layer 140, a dry film 142 is bonded on the polyimide resin layer as a fourth sacrificial layer (FIG. 8 (*a*)). Thereafter, as shown in FIG. 8 (*b*), an opening 144 opened on the conductive path 18*a* via the fourth sacrificial layer 142 and the underlying polyimide resin layer 140 is formed by laser beam.

In this opening 144 is deposited a metal material for a pad or a bump 146 by plating, as shown in FIG. 8 (*c*). As a metal material for the bump 146, nickel may be deposited, for example.

Apart of the bump 146 protruded from the surface of the fourth sacrificial layer 142 undergoes an abrasion process so as to be flat (FIG. 8 (*d*)), and on this flat surface is formed a gold layer 148 for favorable electrical contact with the aforementioned wiring path of the aforementioned rigid wiring board 12 by, for example, a plating technique.

Figure 9:
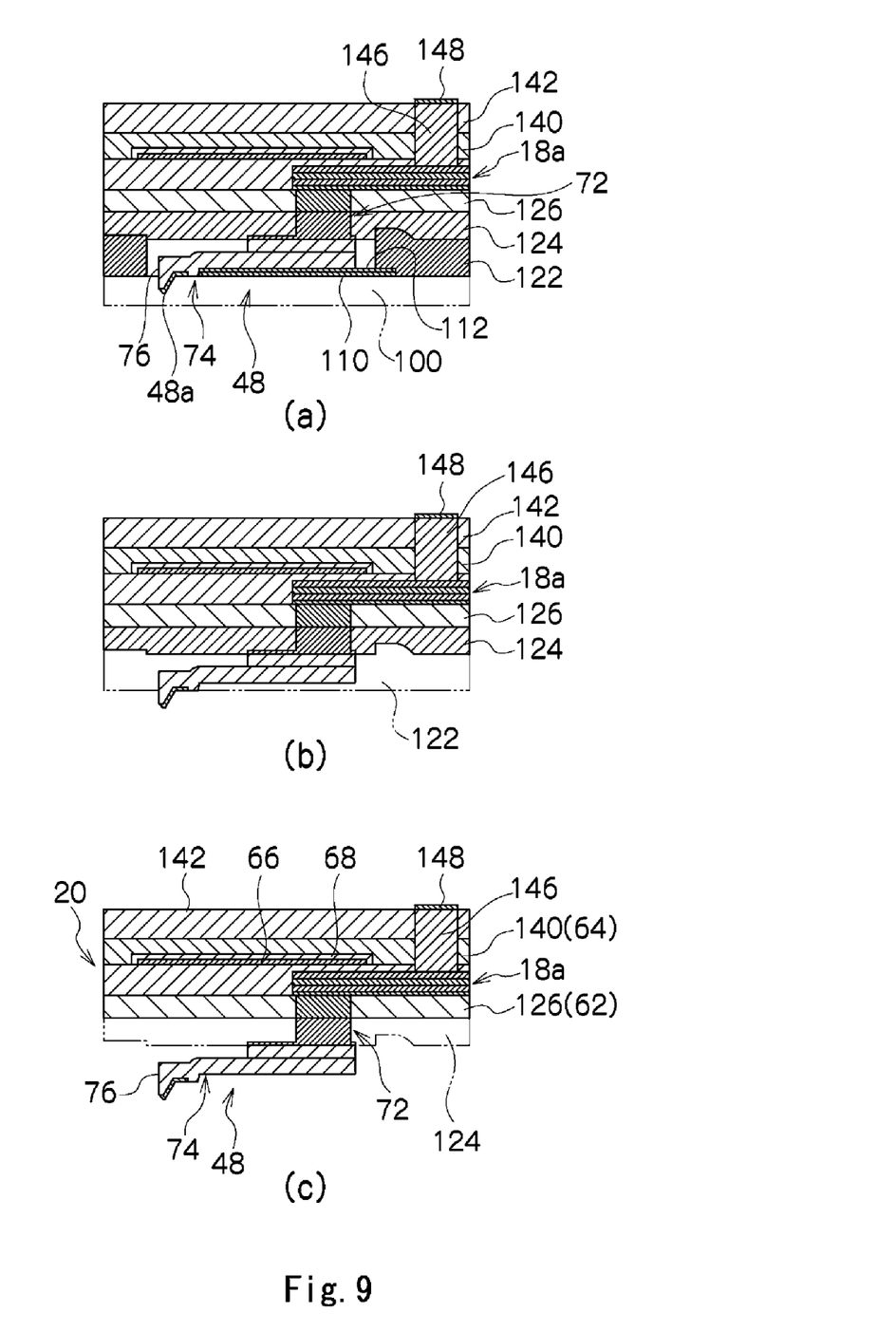
FIG. 9 is a process description diagram (No. 5) showing a process for manufacturing the probe sheet according to the present invention.

After formation of the gold layer 148, the probe sheet main body 18 is removed from the base table 100 together with the second sacrificial layer 122, the fourth sacrificial layer 142, and so on, as shown in FIG. 9 (a). At this moment, even if a part of the detaching force acts as a bending force on the contactor area 50 of the probe sheet main body 18 via the probes 48, deformation of the contactor area 50 is restricted by the reinforcing plate 66 buried inside the contactor area 50.

Accordingly, displacement of the posture of each probe 48 and the probe tip 48a caused by this detachment is prevented.

After removal of the base table 100 as a result of detachment of the probe 48, the aforementioned first sacrificial layer consisting of the nickel layer 110 and the copper layer 112 and the second sacrificial layer 122 are respectively removed by an etching process (FIG. 9 (b)). Also, the dry film 124 exposed as a result of removal of the second sacrificial layer 122 is removed (FIG. 9 (c)), and further the fourth sacrificial layer 142 is removed.

Thereafter, the outline of the probe sheet main body 18 shown in FIG. 2 is set by a laser process or a cutting process by means of a cutter, and openings that receive the positioning pins 56 and elongated holes that receive the alignment pins 60 are respectively formed at locations that are not in the way of the conductive paths 18a of the probe sheet main body 18, thus to form the probe sheet 20.

According to the aforementioned method for manufacturing the probe sheet 20 according to the present invention, the metal material for forming the arm main body portion 74a continuing into the probe tip portion 76 is deposited on the base table 100 with an approximately uniform height dimension by using the pattern mask 114. Also, the metal material for the reinforcing portion 74b constituting the arm portion 74 together with the arm main body portion 74a is deposited at an area on the arm main body portion 74a distanced from the probe tip portion 76 with an approximately uniform height dimension by using the pattern mask 116. Further, the metal material for forming the base portion 72 that is connected to the reinforcing portion 74b is deposited without covering the step 78 consisting of one end of the reinforcing portion 74b located on the probe tip portion 76 side and the arm main body portion 74a.

In this manner, by using the two-step mask using the both pattern masks 114, 116 made of photoresist films for formation of the arm portion 74 of the probe 48, the probe 48 having the arm portion 74 in which a height dimension (h1+h2) at the coupling portion of the arm portion 74 continuing into the base portion 72 is larger than a height dimension (h1) at the portion 74a of the arm portion 74 on the probe tip portion side can be formed relatively easily.

Also, since the probe sheet main body 18 can be formed integrally with the probes 48 efficiently, the probe sheet 20 having the probes 48 according to the present invention can be formed relatively easily and efficiently.

In the aforementioned exemplified manufacturing method, the base portion 72 is formed on the reinforcing portion 74b of the arm portion 74 so that it is continuing into the main body portion 74a via the reinforcing portion 74b. Instead of this example, the base portion 72 may be formed integrally with the main body portion 74a and the reinforcing portion 74b so that it contacts the end portion of the arm portion 74, that is, it contacts the end portions of the main body portion 74a and the reinforcing portion 74b provided on the main body portion, respectively.

The present invention is not limited to the above embodiments but may be altered in various ways without departing from the spirit and scope of the present invention.

What is claimed is:

1. An electrical connecting apparatus comprising:

a probe sheet main body having flexible electrical insulating synthetic resin films and conductive paths supported by said synthetic resin films; and a plurality of probes formed to be protruded from one surface of said probe sheet main body and connected to said conductive paths, wherein each of said probes comprises a base portion combined with said conductive path and formed to be protruded from said one surface of said probe sheet main body, an arm portion continuing into said base portion and extending in a lateral direction with a space from said one surface of said probe sheet main body, and a probe tip portion protruded at an extending end of said arm portion in a direction distanced from said one surface of said probe sheet main body, and in terms of said arm portion, wherein said arm portion has an arm main body portion having a first uniform height dimension ($h_1$) and a reinforcing portion having a second uniform height dimension ($h_2$) on said arm main body portion, wherein said arm main body portion extends to said probe tip portion, and wherein said reinforcing portion is located at a coupling portion with said base portion.

2. The electrical connecting apparatus according to claim 1, wherein a step across the extending direction of said arm portion is formed on one surface of said arm portion facing said probe sheet main body, and a height dimension of said arm portion at a part located on said base portion side from said step is larger than a height dimension at a part located on said probe tip portion side from said step.

3. The electrical connecting apparatus according to claim 1, wherein said plurality of probes are formed by integrally forming said probes on a base table by sequentially depositing metal materials for said plurality of probes in an order from a material for probe tips to a material for base portions with use of a photolithographic technique, forming over said base table said probe sheet main body to be combined with said base portions of said respective probes held on said base table, and detaching said probes together with said probe sheet main body from said base table.

4. The electrical connecting apparatus according to claim 1, wherein said arm main body portion and said reinforcing portion are formed continuously and integrally.

5. The electrical connecting apparatus according to claim 1, wherein said arm portion is connected to said base portion at said reinforcing portion.

6. An electrical connecting apparatus comprising:

a probe sheet main body having flexible electrical insulating synthetic resin films and conductive paths supported by the synthetic resin films; and a plurality of probes protruding from a surface of the probe sheet main body and electrically connected to the conductive paths;

wherein each of the plurality of probes comprises:

base portion combined with a respective one of the conductive paths and protruding downward from the surface of the probe sheet main body;

an arm portion extending laterally from a lower end of the base portion and spaced apart from the surface of the probe sheet main body; and a probe tip portion formed at an extending end of the arm portion and protruding downward and distanced away from the surface of the probe sheet main body;

wherein the arm portion comprises a main body portion having a uniform height dimension ($h_1$) from the base portion to the probe tip portion, and a reinforcing portion extending above and integrated with a portion of the main body portion and continuing into the base portion, the reinforcing portion forming a step on the arm portion, the step having a height dimension ($h_2$) above the main body portion.

* * * * *